(12) United States Patent
Hsue et al.

(10) Patent No.: US 6,391,760 B1
(45) Date of Patent: May 21, 2002

(54) METHOD OF FABRICATING LOCAL INTERCONNECT

(75) Inventors: C. C. Hsue, Hsinchu; Wei-Chung Chen, Tainan, both of (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/208,734

(22) Filed: Dec. 8, 1998

(51) Int. Cl.$^7$ .................................. H01L 21/4763
(52) U.S. Cl. .................. 438/618; 438/599; 438/598; 438/597
(58) Field of Search ..................... 438/675, 129, 438/597, 598, 599, 618, 669

(56) References Cited

U.S. PATENT DOCUMENTS

| | | | |
|---|---|---|---|
| 5,188,979 A | * | 2/1993 | Filipiak |
| 5,488,013 A | * | 1/1996 | Geffken et al. |
| 5,936,306 A | * | 8/1999 | Jeng |
| 5,940,735 A | * | 8/1999 | Mehta et al. |
| 5,960,303 A | * | 9/1999 | Hill |
| 6,001,730 A | * | 12/1999 | Farkas et al. |
| 6,004,876 A | * | 12/1999 | Kwon et al. |

OTHER PUBLICATIONS

Jeng et al., "A Noevl TiSi2/TiN Clad Local Interconnect Technology", May 1993, 1993 Symposium on VLSI Technology, pp. 105–106.*
D. Bartelink et al., "Interconnects for Submicron ASIC's", May 1989, 1989 International Symposium on VLSI Technology, pp. 59–62.*

* cited by examiner

Primary Examiner—Charles Bowers
Assistant Examiner—Evan Pert

(57) ABSTRACT

A method of forming a local interconnect is provided. A semiconductor is provided. An isolation structure, a transistor and a conductive layer are formed on the substrate. A dielectric layer with an opening is formed over the substrate. A part of the dielectric layer is removed by a photolithography and etching process to form a via opening to expose a part of the gate of the transistor or a part of the conductive layer. A conformal barrier layer is formed in the via opening and overflows the dielectric layer. A conductive plug is formed in the via opening. The barrier layer is patterned to form a local interconnect.

12 Claims, 3 Drawing Sheets

METHOD OF FABRICATING LOCAL INTERCONNECT

BACKGROUND OF THE INVENTION

1. Field of the Invention

The invention relates in general to a method of fabricating integrated circuit (ICs), and more particularly to a method of fabricating a local interconnect.

2. Description of the Related Art

For a metallization structure in a semiconductor, a barrier layer is usually formed between a metal layer and a silicon layer or a dielectric layer in order to avoid a phenomenon in which the metal layer diffuses into the silicon layer or the dielectric layer. This can also avoid the occurrence of shorts or openings in the metal layer, which result from the phenomena of spiking or electromigration.

FIG. 1 is a schematic cross-sectional view showing a conventional via structure comprising a barrier layer. A conductive layer 11 is formed on a semiconductor substrate 10. A dielectric layer 12 with a via opening therein is formed on the conductive layer 11. A conductive material 14 with good conductivity fills the via opening. Furthermore, a barrier layer 13 is formed between the conductive material 14 and the dielectric layer 12 or between the conductive material 14 and the conductive layer 11 to enhance the adhesion of the conductive material 14 and to prevent diffusion of the conductive material 14.

FIG. 2 is a cross-sectional view showing a conventional dual damascene process. A conductive layer 21 is formed on a provided substrate 20. A dielectric layer 22 is formed on the conductive layer 21. A first opening 23 is formed in the dielectric layer 22. A second opening 24 is formed in the dielectric layer 22 positioned under the first opening 23 to expose a part of the conductive layer 21. A conformal barrier layer 25 is formed on the dielectric layer 22. A conductive material 26 is formed on the barrier layer 25 to fill the first opening 23 and the second opening 24. A conventional dual damascene process is thus completed.

In the design of a sub-micron integrated circuit, a local interconnect is formed to improve packing density. In circuit layout design, a local interconnect is used for horizontal connection between closely spaced devices.

Various types of local interconnects have been developed and applied in integrated circuit design. The material used for fabricating a local interconnect includes refractory metal silicide on poly-silicon, single or double doped poly-silicon, multi-layered refractory metal which is partially converted into silicide, or refractory metal formed by physical vapor deposition (PVD) or chemical vapor deposition (CVD).

A via structure comprising a barrier layer described above is often required before performing a local interconnect process for horizontal connection between closely spaced devices. That means a barrier layer and a conductive layer overflowing a via opening or a trench have to be removed before performing the local interconnect process. Extra steps are thus required that not only complicate a device fabrication but also increase fabricating cost.

SUMMARY OF THE INVENTION

It is therefore an object of the invention to provide a method of fabricating a local interconnect using a barrier layer as a local interconnect without extra steps. A barrier layer as the local interconnect is very thick so that the filling ability of the barrier layer is good for small trenches or via openings. No other conductive material is formed after forming the barrier layer. A problem of difficulty in filling a conductive layer into a via opening or a trench after forming the barrier layer as seen in formation of a conventional local interconnect is thus avoided.

The invention achieves the above identified objects by providing a method of forming a local interconnect. A semiconductor is provided. An isolation structure, a transistor and a conductive layer are formed on the substrate. A dielectric layer with an opening is formed over the substrate. A part of the dielectric layer is removed by a photolithography and etching process to form a via opening to expose a part of the gate of the transistor or a part of the conductive layer. A conformal barrier layer is formed in the via opening and overflows the dielectric layer. A conductive plug is formed in the via opening. The barrier layer is patterned to form a local interconnect.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
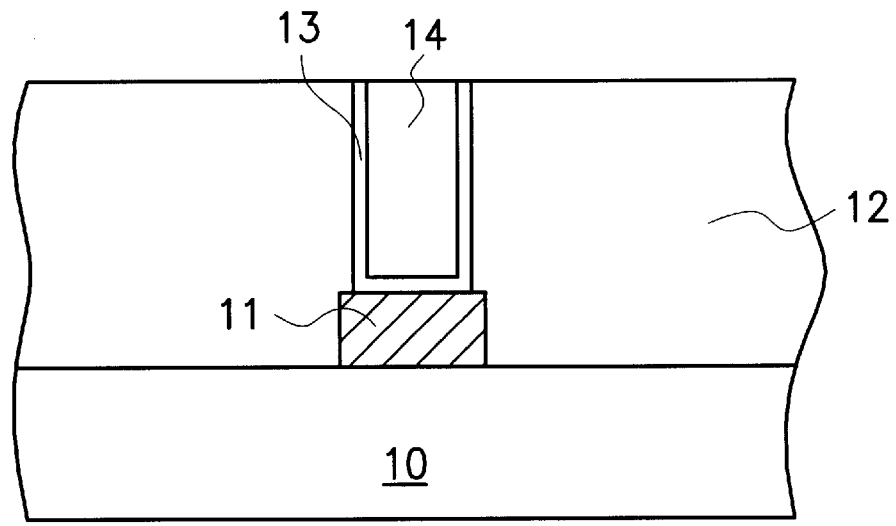
FIG. 1 is a schematic, cross-sectional view showing a conventional via structure comprising a barrier layer.
Figure 2:
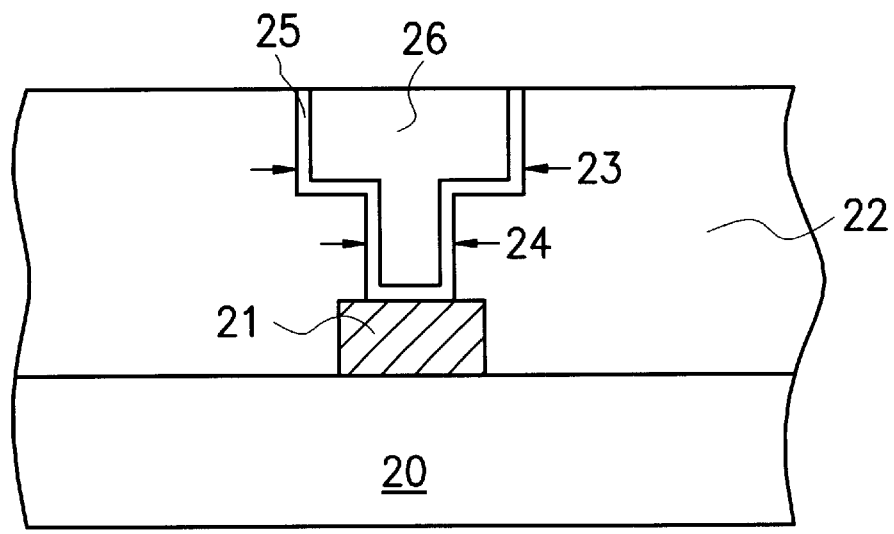
FIG. 2 is a schematic, cross-sectional view showing a conventional dual damascene process.
Figure 3:
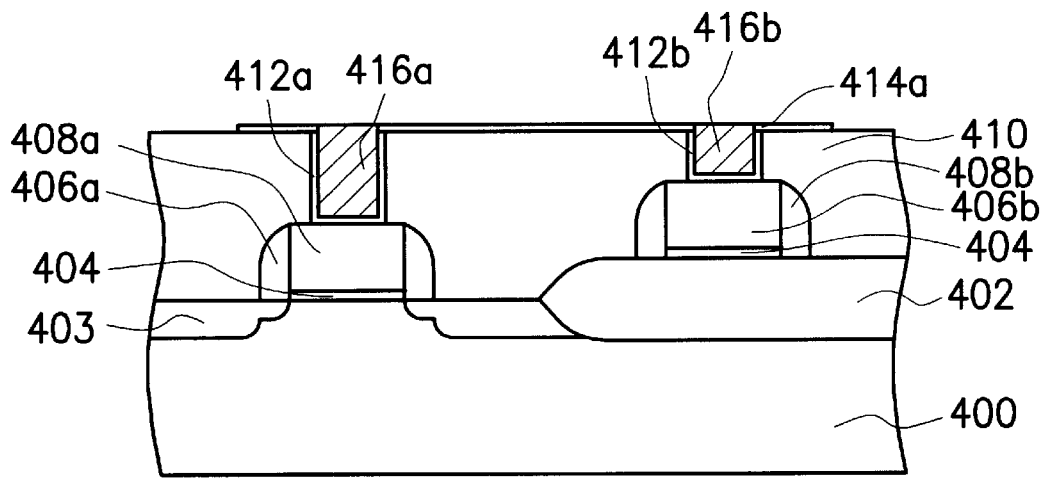
FIG. 3 is schematic, cross-sectional view showing a local interconnect structure of one preferred embodiment of the invention.

FIG. 3 is a schematic, cross-sectional view showing a local interconnect structure of one preferred embodiment of the invention. As shown in FIG. 3, an isolation structure 402, a transistor and a conductive structure on the isolation structure 402 are formed on a provided substrate 400. The transistor comprises a gate oxide layer 404 on the substrate 400, a gate 408a on the gate oxide layer 404, a gate spacer 406a on the side-wall of the gate 406a and a source/drain region 403 in the substrate 400 beside the gate 406a. The conductive structure comprises a gate oxide layer 404 on the isolation structure 402, a conductive layer 406b on the gate oxide layer and a conductive spacer 408b on the sidewall of the conductive layer 406b. A dielectric layer 410, which has a via opening 412a exposing the gate 406a and a via opening 412b exposing the conductive layer 406b, covers the structure described above. A defined barrier layer 414a is formed on the surface of the dielectric layer 410 by patterning barrier layer 114. A conductive plug 416a in the via opening 412a electrically couples with the gate 406a. A conductive plug 416b in the via opening 412b electrically couples with the conductive layer 406b. A part of the defined barrier layer 414a on the surface of the dielectric layer 410 serves as a local interconnect.

Figure 4A:
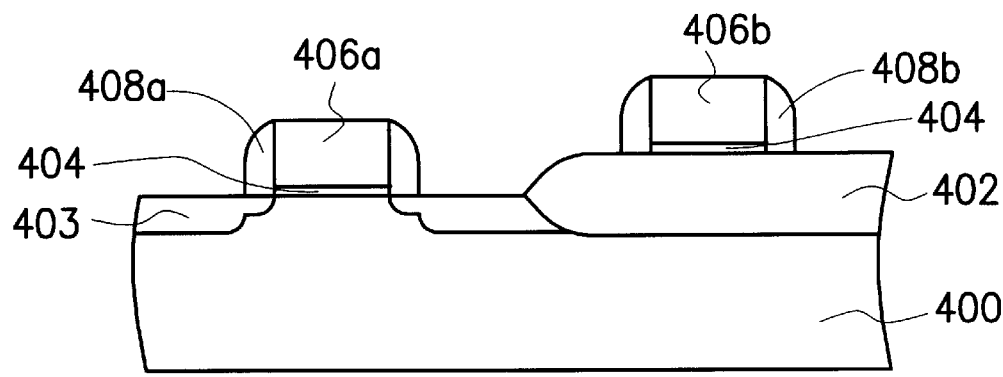
FIGS. 4A to 4D are schematic, cross-sectional views showing the process steps of forming the local interconnect shown in FIG. 3.

FIGS. 4A to 4D are cross-sectional views showing the process steps of forming the local interconnect shown in FIG. 3. In FIG. 4A, the isolation structure 402, the transistor and the conductive structure on the isolation structure 402 are formed on the provided substrate 400. The isolation structure 402 preferably comprises a shallow trench isolation structure or a field oxide layer which can isolate active regions on the substrate from each other.

Figure 4B:
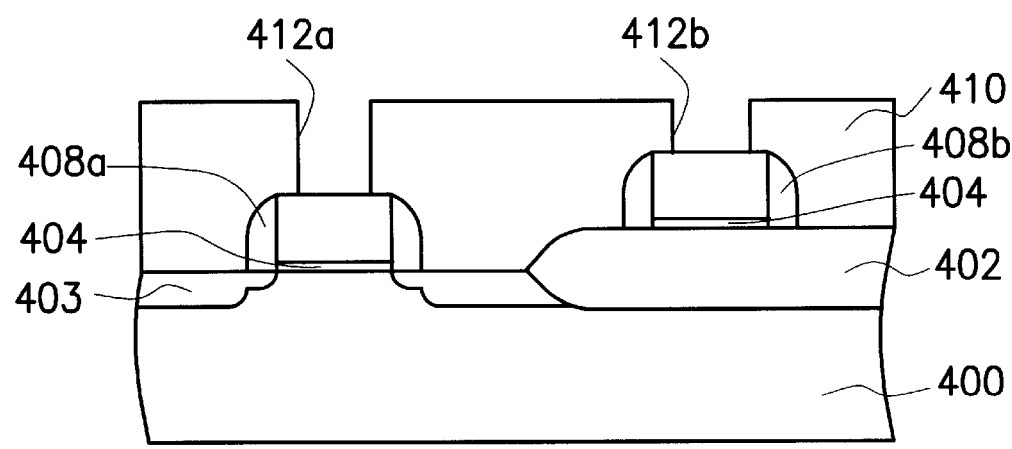

In FIG. 4B, a dielectric layer 410 is formed, for example, by chemical vapor deposition (CVD) to cover the structure shown in FIG. 4A. A preferred material of the dielectric layer comprises silicon oxide. A via opening 412a exposing a part of the gate 406a (FIG. 4A) and a via opening 412b exposing a part of the conductive layer 406b (FIG. 4A) are formed in the dielectric layer 410.

Figure 4C:
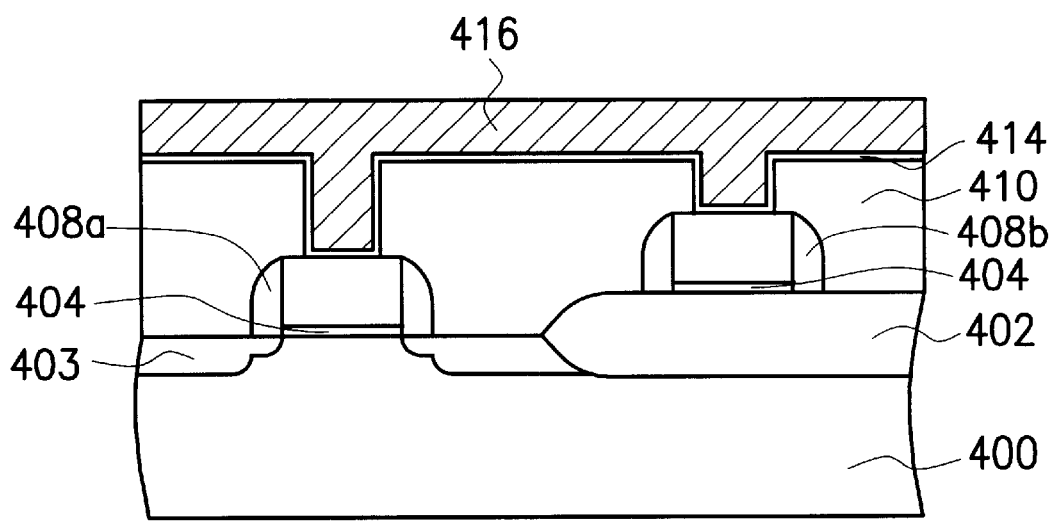

In FIG. 4C, a thick barrier layer is conformally formed on the dielectric surface. A material of the barrier layer 414 is selected from a group consisting of titanium/titanium nitride (Ti/TiN), titanium tungsten (TiW), tungsten nitride (WN), tantalum (Ta) and tantalum nitride (TaN). The preferred material is titanium/titanium nitride (Ti/TiN). For example, a first metal layer (Ti) of the barrier layer is deposited by DC sputtering using argon (Ar) and has a thickness of about 200–500 Å. A second metal layer (TiN) of the barrier layer is formed by nitridation or reactive sputtering and has a thickness of about 500–1500 Å. A conductive layer 416 is formed on the dielectric layer to fill the via openings 412a, 412b. A material of the conductive layer 416 has a good conductivity and preferably comprises tungsten, copper aluminum or Al/Cu alloy.

Figure 4D:
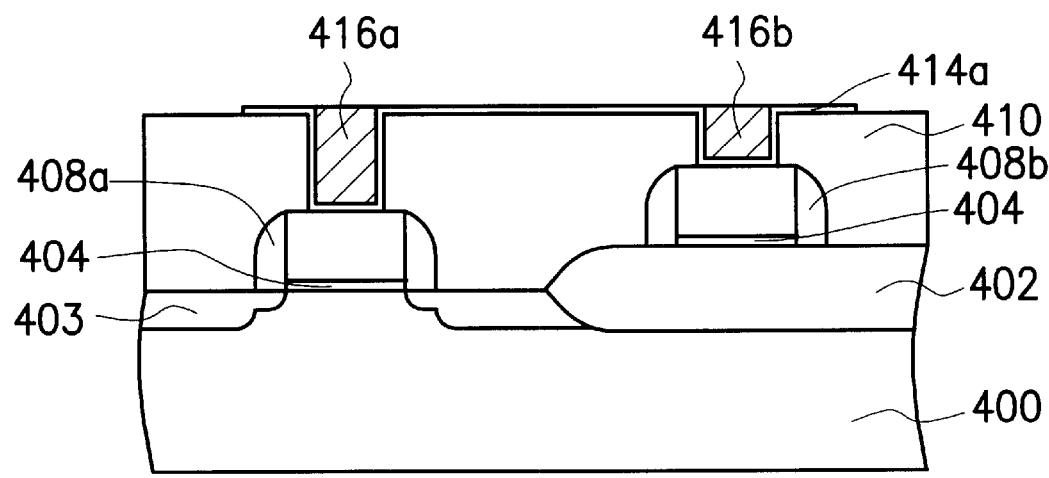

In FIG. 4D, a part of the conductive layer 416, which overflows the via openings 412a and 412b, is removed, for example, by chemical-mechanical polishing (CMP) to form conductive plugs 416a and 416b in the via openings 412a and 412b. The barrier layer 414 is patterned by photolithography and etching process. The patterned defined barrier layer 414a is used as the local interconnect.

A feature of the invention is that the barrier is defined to form a local interconnect after forming the conductive plug. Steps of forming a conventional local interconnect are not required, such that the method simplifies the process and saves costs associated with forming the local interconnect. Furthermore, the barrier layer is thick enough so that a good resolution is obtained while performing a photolithography and etching process and the packing density is increased.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a local interconnect, comprising the steps of:

providing a substrate, wherein the substrate at least has a first conductive layer thereon;

forming a dielectric layer on the substrate and on the conductive layer, wherein the dielectric layer has a via opening exposing a part of the first conductive layer;

forming a conformal barrier layer on the dielectric layer;

forming a second conductive layer on the conformal barrier layer and overflowing the via opening;

removing a part of the second conductive layer to form a conductive plug in the via opening and to expose the barrier layer formed on an upper horizontal surface of the dielectric layer; and after the step of forming the plug, patterning the conformal barrier layer to form the local interconnect.

2. The method according to claim 1, wherein a material of the dielectric layer comprises silicon oxide.

3. The method according to claim 1, wherein a material of the barrier layer comprises titanium/titanium nitride.

4. The method according to claim 3, wherein the titanium of the barrier layer has a thickness of about 200–500 Å.

5. The method according to claim 3, wherein the titanium nitride of the barrier layer has a thickness of about 500–1500 Å.

6. The method according to claim 1, wherein a material of the second conductive layer is selected from a group consisting of tungsten, copper and aluminum copper alloy.

7. A method of forming a local interconnect, comprising the steps of:

providing a dielectric layer with a via opening;

forming a conformal barrier layer on the surface of the dielectric layer;

forming a conductive plug in the via opening when exposing the barrier layer on an upper horizontal surface of the dielectric layer; and after the step of forming the plug, patterning the conformal barrier layer to expose a part of the dielectric layer to form the local interconnect.

8. The method according to claim 7, wherein a material of the dielectric layer comprises silicon oxide.

9. The method according to claim 7, wherein a material of the barrier layer comprises titanium/titanium nitride.

10. The method according to claim 9, wherein titanium of the barrier layer has a thickness of about 200–500 Å.

11. The method according to claim 9, wherein the titanium nitride of the barrier layer has a thickness of about 500–1500 Å.

12. The method according to claim 7, wherein a material of the second conductive layer is selected from a group consisting of tungsten, copper and aluminum copper alloy.

* * * * *